US005879174A

United States Patent [19]

Kountz et al.

[11] Patent Number: 5,879,174

[45] Date of Patent: Mar. 9, 1999

[54] DIMENSIONAL VARIANCE SPRING

[75] Inventors: John George Kountz, Poland; John Henry Bakker, Cortland, both of Ohio

[73] Assignee: General Motors Corporation, Detroit, Mich.

[21] Appl. No.: 908,153

[22] Filed: Aug. 6, 1997

[51] Int. Cl.$^{6}$ ..................... H01L 21/22

[52] U.S. Cl. ..................... 439/141

[58] Field of Search ..................... 439/140, 141, 439/381

[56] References Cited

U.S. PATENT DOCUMENTS

| | | | |
|---|---|---|---|
| 4,832,613 | 5/1989 | Tsukakoshi | 439/141 |
| 5,501,606 | 3/1996 | Oda et al. | 439/141 |
| 5,533,909 | 7/1996 | Endo et al. | 439/381 |

*Primary Examiner*—Neil Abrams
*Assistant Examiner*—Briggitte R Hammond
*Attorney, Agent, or Firm*—Cary W. Brooks

[57] ABSTRACT

The present invention includes a first component having a dimensional variance spring for connection to a second component where alignment is critical and dimensional variances between the components may be present. Preferably, the invention includes a male blade stabilizer having a dimensional variance spring. The stabilizer includes first and second plates separated by a plurality of slots. Edges of the first and second plates are connected together by an angular web. Each plate has a plurality of apertures formed therein, each for receiving the male blade of a terminal carried by a male connector part. The angular web acts as a spring allowing movement of the plates in a direction perpendicular to the slots to assure proper fit of the stabilizer inside the connector shroud and insertion of each male blade through an associated aperture in the stabilizer.

5 Claims, 2 Drawing Sheets

DIMENSIONAL VARIANCE SPRING

TECHNICAL FIELD

This invention relates to mating components, and more particularly, to a male blade stabilizer for use with a male electrical connector.

BACKGROUND OF THE INVENTION

Manufacturing dimensionally accurate mating components is difficult when the mating components do not have substantially similar configurations. Heretofore, simple male blade stabilizers having a flat planar portion with apertures therethrough have been used to receive the terminal blades of a male electrical connector. The male blade stabilizer is simple in configuration and is easy to manufacture with very small tolerances. However, the male electrical connector has a relatively complicated configuration that on occasion causes substantial dimensional variances. The male electrical connector includes a body portion having a plurality of cavities formed therein for receiving a portion of a male blade terminal. Flexible locking arms extend from the body portion into the cavity to secure the terminal in place. A shroud extends outwardly from the body portion to protect the blades and to receive the male blade stabilizer. As a result of dimensional variances, it may become difficult to insert the male blade stabilizer into the male connector shroud, or to insert the male terminals into the cavities of the body portion and through the apertures of the male blade stabilizers. Heretofore, molding tool revisions were required to correct minor dimensional difficulties between these mating components.

When male blade terminals are inserted into the cavities of the male connector, the blade may not be properly aligned due to dimensional tolerances or because the locking feature does not sufficiently secure the terminal to prevent pivotal movement of the blades. The male blade stabilizer keeps the center line of the male blades within predetermined specification if they are properly received and aligned in the male connector. Prior art stabilizers failed to consistently achieve this objective.

The present invention provides advantages over and alternatives to the prior art.

SUMMARY OF THE INVENTION

The present invention includes a first component having a dimensional variance spring for connection to a second component where alignment is critical and dimensional variances between the components may be present. Preferably, the invention includes a male blade stabilizer having a dimensional variance spring. The stabilizer includes first and second plates separated by a plurality of slots. Edges of the first and second plates are connected together by an angular web. Each plate has a plurality of apertures formed therein, each for receiving the male blade of a terminal carried by a male connector part. The angular web acts as a spring allowing movement of the plates in a direction perpendicular to the slots to assure proper fit of the stabilizer inside the connector shroud and insertion of each male blade through an associated aperture in the stabilizer.

In a preferred embodiment, the stabilizer includes slots cut longitudinally through the center of the male blade stabilizer to define two plates. Connecting the edges of the plates are two thick webs. The webs are at a 15 degree angle from a longitudinal axis through the stabilizer and are the mirror image of one another about a vertical center line. The webs are located approximately half way between the vertical center line and the edge of the stabilizer. The slots and the two opposing angular webs provide a male blade stabilizer which acts as a spring and allows movement of the two plates in a direction perpendicular to the slots without jeopardizing the function of the stabilizer. The dimensional variance spring stabilizer assures a proper fit of the stabilizer during assembly and provides proper alignment between the terminal slots of the stabilizer and the mating connector when minor dimensional variances occur. The stabilizer thus eliminates tooling costs and time associated with correcting minor dimensional discrepancies between mating components. The use of a dimensional variance spring as provided in the stabilizer can be adapted to most components where alignment is critical and dimensional variances may occur.

These and other objects, features and advantages of the present invention will become apparent from the following brief description of the drawings, detailed description, and appended claims and drawings.

DESCRIPTION OF THE PREFERRED EMBODIMENT

Figure 2:
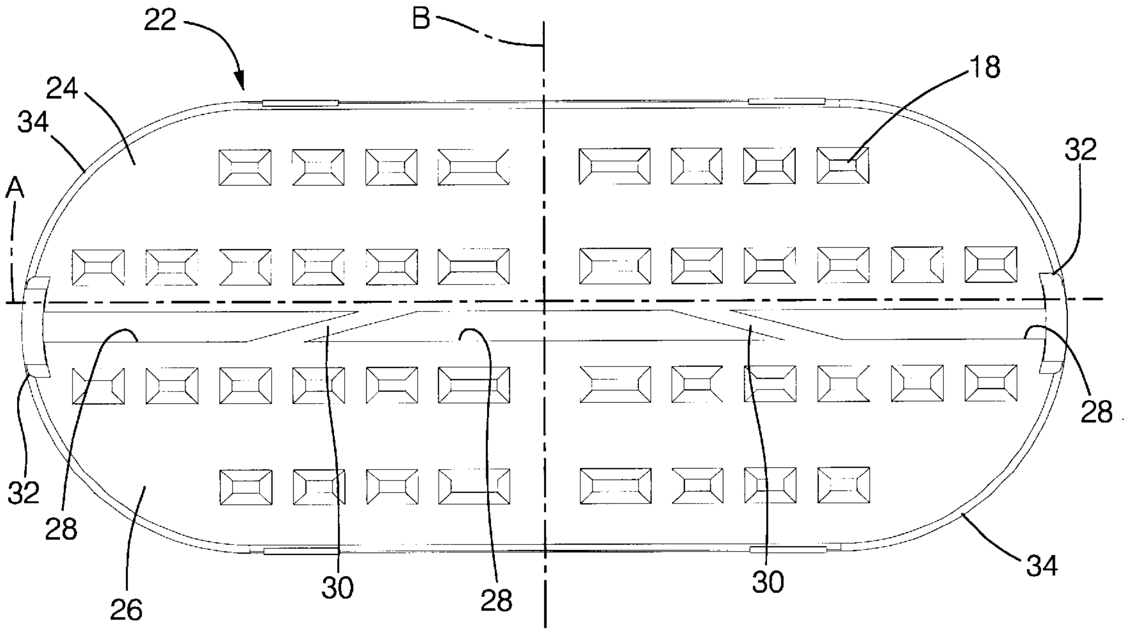
FIG. 2 is an end view of a male blade stabilizer according to the present invention with male blades inserted through apertures in the stabilizer.
Figure 3:
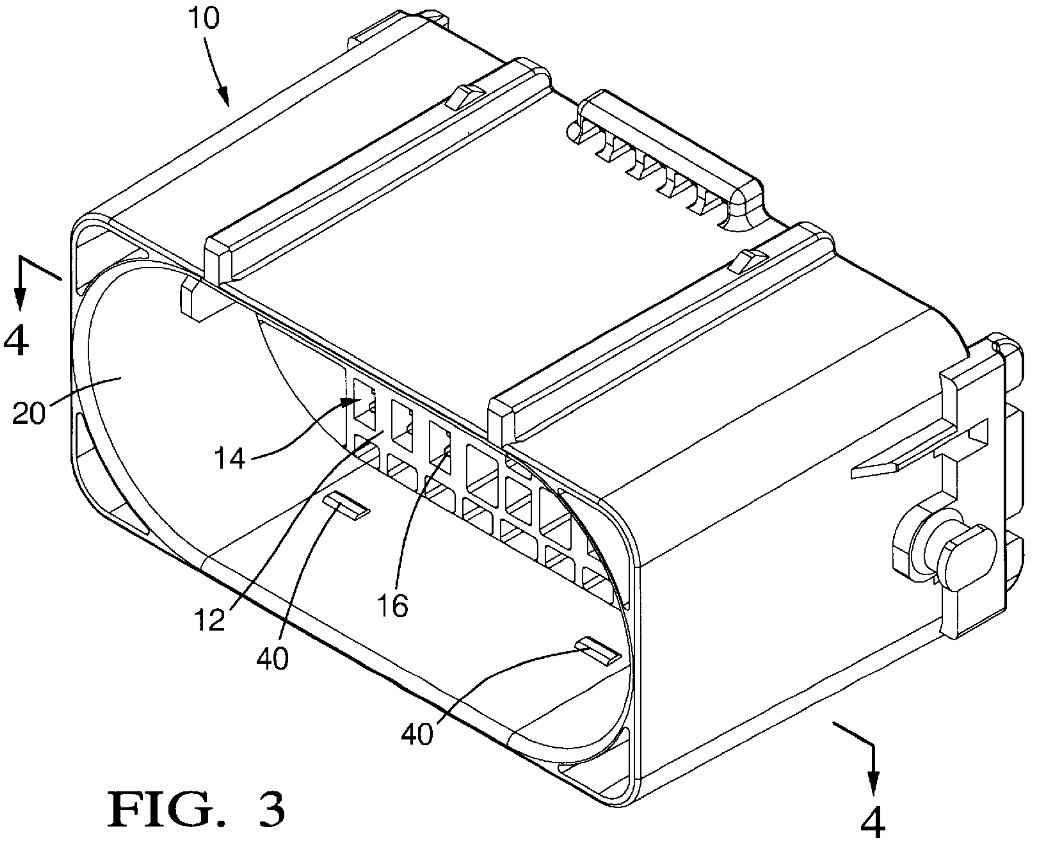
FIG. 3 is a perspective view of a male connector for receiving a male blade stabilizer according to the present invention.
Figure 4:
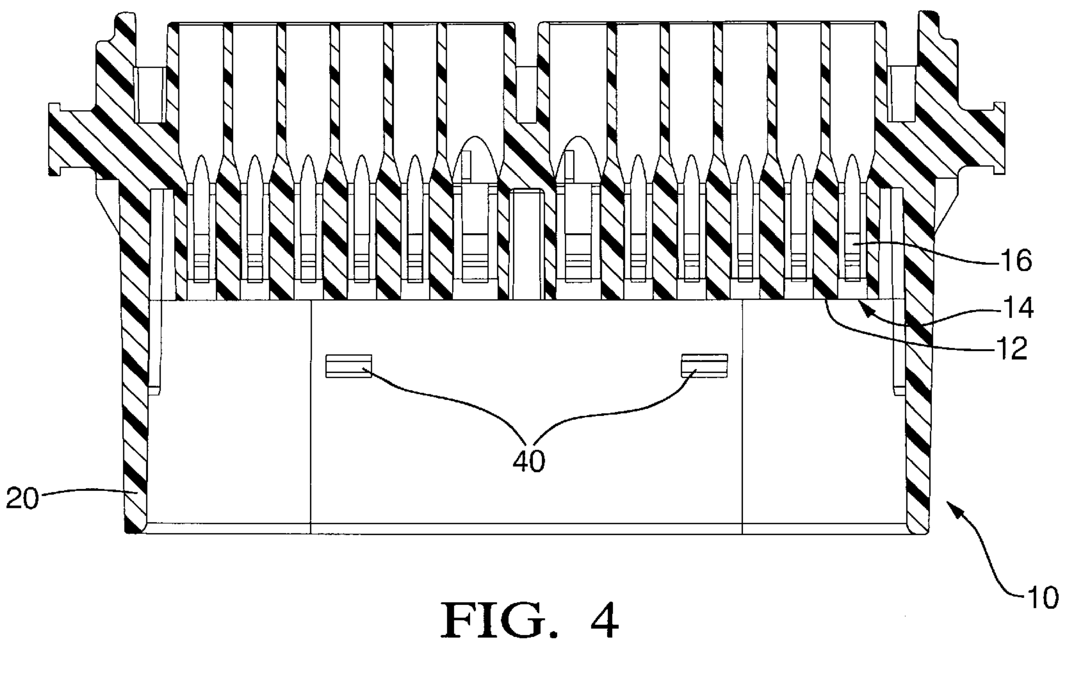
FIG. 4 is a sectional view taken along line 4—4 of FIG. 3.

As can be seen in FIGS. 3 and 4, a male connector 10 useful in the present invention includes a central body portion 12 having a plurality of cavities 14 formed therethrough each for receiving a portion of a male blade terminal (not shown). The body portion 12 may include locking features 16 such as flexible lock arms extending into the cavities 14 for mating with features on the male blade terminal and locking the terminal in place. Flat male blade 18 of the terminals (shown in FIG. 2) extend outwardly from the central body portion 12 of the connector. A shroud 20 extends outwardly from the central body portion 12 surrounding and protecting the flat male blade portion 18 of the terminal. Alignment projections 38 and locking nubs 40 may be provided on the inside face of the male connector shroud 20.

Figure 1:
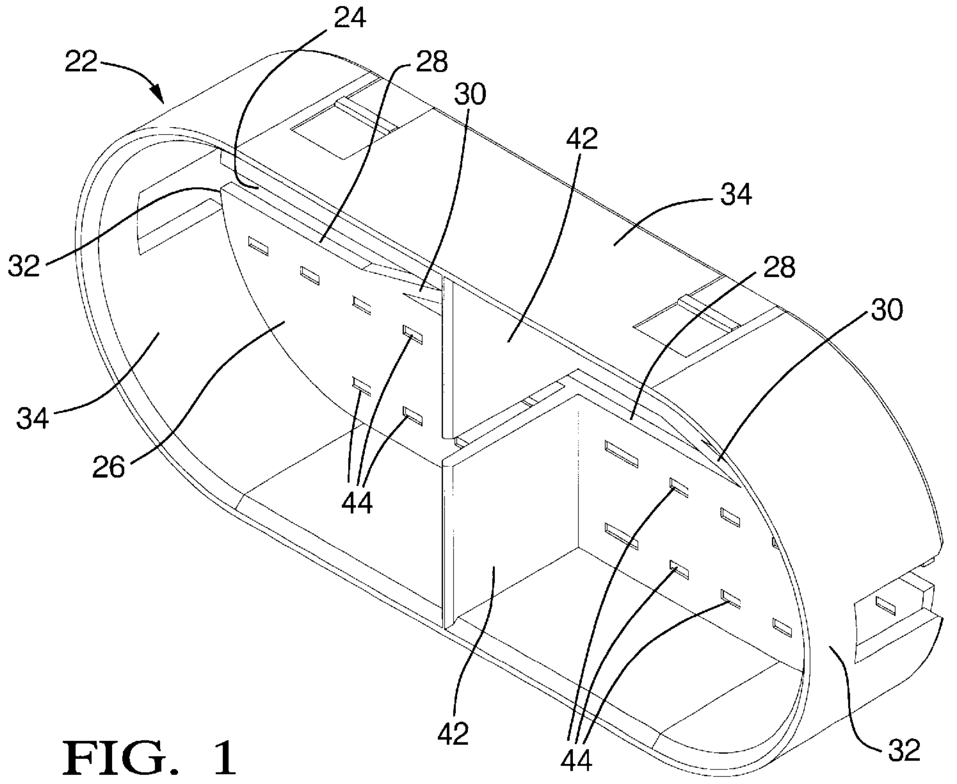
FIG. 1 is a perspective view of a male blade stabilizer according to the present invention.

FIGS. 1 and 2 illustrate a male blade stabilizer 22 of the present invention which includes a first and second plate 24, 26 each having a plurality of apertures 44 for receiving a male blade 18 of the male connector 10. The first and second plates 24, 26 are separated by a plurality of slots 28. The first and second plates 24, 26 are joined together at edges by angular webs 30. These webs 30 are preferably at a 15 degree angle from the horizontal axis A and are mirror images of one another about a vertical center line B. The webs 30 are located approximately one-half way between the vertical center line B and the end 32 of the stabilizer. The plurality of slots 28 along with the two opposing angular webs 30 allow the male blade stabilizer to act as a spring providing movement of the plates 24, 26 in a direction perpendicular to the slots 28 without jeopardizing the function of the stabilizer. The male blade stabilizer with dimensional variance spring features assures a proper fit of the stabilizer during assembly to the connector part and provides proper alignment between terminal apertures 44 formed in the stabilizer plates 24, 26 and the male connector when minor dimensional variances are present. Thus, the present invention eliminates tooling costs and time associated with correcting minor dimensional discrepancies between mating components. This dimensional variance spring can be adapted to most components where alignment is critical and dimensional variances are likely.

The male blade stabilizer 22 may include a shroud 34 extending from the two flat plate sections. Alignment grooves 36 may be formed in the stabilizer shroud 34 for mating with alignment projections 38 formed on the inside face of the male connector shroud 20. Mating locking features may be provided on the stabilizers corresponding to the lock nubs 40 on the male connector 10. Spaced apart support beams 42 may traverse the inside of the stabilizer shroud 34.

To assemble, the male blade stabilizer 22 is inserted into the male connector shroud 20 of the male connector 10 with the plates 24, 26 closest to the body portion 12. Thereafter the male terminals are inserted into the cavities 14 in the male connector 10 and locked in place by the locking features 16 so that the male blades 18 extend outwardly from the body portion 12 and through an associated aperture 44 in the male blade stabilizer 22. The plates 24, 26 are moved in a perpendicular direction to the slots 28 so that each of the male blades 18 is properly received in an aperture 44. The male blade stabilizer 22 assures that the center line of the male blades are within predetermined specifications.

We claim:

1. A product comprising:

a male electrical connector part having a body portion and a shroud extending from the body portion, the body portion having a plurality of cavities formed therein, each cavity for receiving a portion of a male terminal;

a dimensionally variable male terminal blade stabilizer received inside the shroud of the male connector, the stabilizer having a first and second plate separated from each other by a plurality of slots, and wherein edges of the first and second plates are connected by an angular web and each plate has a plurality of male blade apertures formed therethrough each for receiving a male blade of a terminal carried in the male connector part, and wherein the angular web acts as a spring allowing movement of the plates in a direction perpendicular to the slots to assure proper fit of the stabilizer inside the shroud of the male connector.

2. A product as set forth in claim 1 wherein the stabilizer includes two opposed angular webs.

3. A product as set forth in claim 1 wherein the plurality of slots extend through the center of the stabilizer and the stabilizer includes two angular webs that are mirror images of each other.

4. A product as set forth in claim 3 wherein the webs are located about half way between a vertical center line of a stabilizer and an end of a stabilizer.

5. A product as set forth in claim 3 wherein each web is formed at about a 15 degree angle with respect to a horizontal axis of the stabilizer plates.

* * * * *